(12) United States Patent
Ooyabu

(10) Patent No.: US 7,286,370 B2
(45) Date of Patent: Oct. 23, 2007

(54) WIRED CIRCUIT BOARD AND CONNECTION STRUCTURE OF WIRED CIRCUIT BOARD

(75) Inventor: Yasunari Ooyabu, Osaka (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 11/135,511

(22) Filed: May 24, 2005

(65) Prior Publication Data

US 2005/0272276 A1    Dec. 8, 2005

(30) Foreign Application Priority Data

May 25, 2004 (JP) .............................. 2004-155107

(51) Int. Cl.
*H05K 1/11* (2006.01)
*H05K 1/14* (2006.01)

(52) U.S. Cl. .................. 361/803; 174/261; 361/810

(58) Field of Classification Search ........ 174/261–266; 361/803, 767–771, 807–810
See application file for complete search history.

(56) References Cited

U.S. PATENT DOCUMENTS

| | | | |
|---|---|---|---|
| 4,843,191 A * | 6/1989 | Thomas .................... | 174/88 R |
| 5,225,633 A * | 7/1993 | Wigginton ................. | 174/84 R |
| 5,321,585 A | 6/1994 | Trittschuh, III et al. | |
| 5,526,563 A * | 6/1996 | Tamaki et al. .............. | 29/830 |
| 5,742,484 A * | 4/1998 | Gillette et al. .............. | 361/789 |
| 6,040,529 A * | 3/2000 | Takeshita et al. ........... | 174/254 |
| 6,118,081 A * | 9/2000 | Faragi et al. ................ | 174/260 |
| 6,239,012 B1 * | 5/2001 | Kinsman ..................... | 438/612 |
| 6,399,899 B1 | 6/2002 | Ohkawa et al. | |
| 6,469,255 B2 * | 10/2002 | Watanabe et al. ........... | 174/254 |
| 6,594,152 B2 * | 7/2003 | Dent ........................... | 361/785 |
| 6,603,079 B2 * | 8/2003 | Biron ......................... | 174/254 |
| 6,653,575 B2 * | 11/2003 | Armezzani et al. ......... | 174/262 |
| 2002/0009578 A1 * | 1/2002 | Watanabe et al. ........... | 428/209 |
| 2002/0066594 A1 | 6/2002 | Shintani et al. | |
| 2003/0193793 A1 | 10/2003 | Dent | |
| 2004/0050587 A1 * | 3/2004 | Tsukashima ................ | 174/261 |

FOREIGN PATENT DOCUMENTS

| | | |
|---|---|---|
| DE | 100 56 904 A1 | 5/2002 |
| FR | 2 838 873 A1 | 10/2003 |
| JP | 2001-209918 | 8/2001 |
| JP | 2002-124756 | 4/2002 |

\* cited by examiner

*Primary Examiner*—Jeremy C Norris
(74) *Attorney, Agent, or Firm*—Jean C. Edwards, Esq; Akerman Senterfitt

(57) ABSTRACT

A wired circuit board is provided that is formed by connecting a first wired circuit board and a second wired circuit board, which include a first connection terminal and a second connection terminal, respectively. A solder bump is provided to continuously extend over surfaces of the first connection terminal and the second connection terminal to mechanically couple the first wired circuit board and the second wired circuit board. Consequently, the solder bump is not interposed between opposed surfaces of the first connection terminal and the second connection terminal, thereby allowing the electrical connection provided by the solder bump to be confirmed by visual observation.

7 Claims, 4 Drawing Sheets

PRIOR ART

WIRED CIRCUIT BOARD AND CONNECTION STRUCTURE OF WIRED CIRCUIT BOARD

This application claims priority from Japanese patent application Serial No. 2004-155107, filed on May 25, 2004, which is incorporated herein by reference.

BACKGROUND OF THE INVENTION

1. Field of the Invention

The present invention relates to a wired circuit board and a connection structure of the wired circuit board, and more specifically, to a wired circuit board formed by connecting two wired circuit boards to each other and a connection structure of the wired circuit board thereof.

2. Description of the Prior Art

It has been conventionally known that in a case where a circuit board and an external terminal formed in an external circuit are connected to each other, a surface of a conductor layer 26 exposed by opening a cover layer 25 is taken as a terminal portion 27 in a circuit board 24, the terminal portion 27 and an external terminal 33 formed in an external circuit 30 are arranged so as to be opposed such that they are overlapped with each other, and the terminal portion 27 and the external terminal 33 are connected to each other by a solder bump 36, as shown in FIG. 4 (see JP2002-124756, A, for example)

In FIG. 4, the circuit board 24 is formed by successively laminating a base insulating layer 28, the conductor layer 26, and the cover layer 25, and the base insulating layer 28 is provided with a reinforcing plate 29 in correspondence with the terminal portion 27.

The external circuit 30 is formed by successively laminating a base insulating layer 34, a conductor layer 32, and a cover layer 31, a surface of the conductor layer 32 exposed by opening the cover layer 31 is taken as the external terminal 33, and the base insulating layer 34 is provided with a reinforcing plate 35 in correspondence with the external terminal 33.

When such connection is made, however, the solder bump serving as a connection section is interposed between the terminals that are overlapped with each other and is coated with the terminals, thereby making it difficult to confirm the connection from the appearance. After the connecting process is terminated, therefore, electrical continuity inspection is carried out. However, burdens on the number of processes and the cost caused by the continuity inspection are inevitable.

SUMMARY OF THE INVENTION

An object of the present invention is to provide a wired circuit board in which electrical continuity inspection can be omitted and a connection structure of the wired circuit board.

A wired circuit board according to the present invention comprises a first wired circuit board having a first connection terminal, a second wired circuit board having a second connection terminal, and a connection conductive portion for electrically connecting the first connection terminal and the second connection terminal to each other, wherein the first connection terminal and the second connection terminal are arranged so as to be opposed to each other, and the connection conductive portion is connected to the first connection terminal and the second connection terminal so as not to be interposed between opposed surfaces of the first connection terminal and the second connection terminal.

In the wired circuit board according to the present invention, it is preferable that the first connection terminal and the second connection terminal are arranged on the same side with respect to the connection conductive portion, and the connection conductive portion is provided so as to extend over the first connection terminal and the second connection terminal.

Furthermore, in this case, it is preferable that the first connection terminal and the second connection terminal are abutted against each other in the direction in which they are opposed, and the connection conductive portion is continuously provided on surfaces of the first connection terminal and the second connection terminal that are arranged on the same side in the abutted state.

It is preferable that the first connection terminal and the second connection terminal are arranged so as to be partially overlapped with each other, and it is preferable that either one of the first connection terminal and the second connection terminal that are brought into contact with the connection conductive portion is formed with a through hole that penetrates the first connection terminal or the second connection terminal in the thickness direction in a portion where the first connection terminal and the second connection terminal are overlapped with each other.

A connection structure of a wired circuit board in which a first wired circuit board having a first connection terminal and a second wired circuit board having a second connection terminal are connected to each other through a connection conductive portion for electrically connecting the first connection terminal and the second connection terminal to each other, wherein the first connection terminal and the second connection terminal are arranged so as to be opposed to each other, and the connection conductive portion is connected to the first connection terminal and the second connection terminal so as not to be interposed between opposed surfaces of the first connection terminal and the second connection terminal.

In the connection structure of the wired circuit board according to the present invention, it is preferable that the first connection terminal and the second connection terminal are arranged on the same side with respect to the connection conductive portion, and the connection conductive portion is provided so as to extend over the first connection terminal and the second connection terminal.

Furthermore, in this case, it is preferable that the first connection terminal and the second connection terminal are abutted against each other in the direction in which they are opposed, and the connection conductive portion is continuously provided on surfaces of the first connection terminal and the second connection terminal that are arranged on the same side.

It is preferable that the first connection terminal and the second connection terminal are arranged so as to be partially overlapped with each other, and it is preferable that either one of the first connection terminal and the second connection terminal that are brought into contact with the connection conductive portion is formed with a through hole that penetrates the first connection terminal or the second connection terminal in the thickness direction in a portion where the first connection terminal and the second connection terminal are overlapped with each other.

In the wired circuit board according to the present invention and the connection structure of the wired circuit board according to the present invention, the connection conductive portion is connected to the first connection terminal and the second connection terminal so as not to be interposed between the opposed surfaces of the first connection terminal and the second connection terminal. Therefore, it is possible to observe a state where the connection conductive portion is connected to the first connection terminal and the second connection terminal. As a result, electrical continuity inspection can be omitted, so that burdens on the number of processes and the cost caused thereby can be reduced.

BRIEF DESCRIPTION OF THE DRAWINGS

FIG. 1(a) is a cross-sectional view of a principal part, showing a first wired circuit board and a second wired circuit board, FIG. 1(b) is a cross-sectional view of a principal part, showing a state where the first wired circuit board and the second wired circuit board are connected to each other, and FIG. 1(c) is a plan view showing a state where the first wired circuit board and the second wired circuit board are connected to each other;

FIG. 2(a) is a cross-sectional view of a principal part, showing a first wired circuit board and a second wired circuit board, FIG. 2(b) is a cross-sectional view of a principal part, showing a state where the first wired circuit board and the second wired circuit board are connected to each other, and FIG. 2(c) is a plan view showing a state where the first wired circuit board and the second wired circuit board are connected to each other;

FIG. 3(a) is a cross-sectional view of a principal part, showing a first wired circuit board and a second wired circuit board, FIG. 3(b) is a cross-sectional view of a principal part, showing a state where the first wired circuit board and the second wired circuit board are connected to each other, FIG. 3(c) is a plan view, showing a state where the first wired circuit board and the second wired circuit board are arranged before a solder layer is formed, and FIG. (d) is a plan view showing a state where the first wired circuit board and the second wired circuit board are connected to each other.

DETAILED DESCRIPTION OF THE INVENTION

Figure 1:
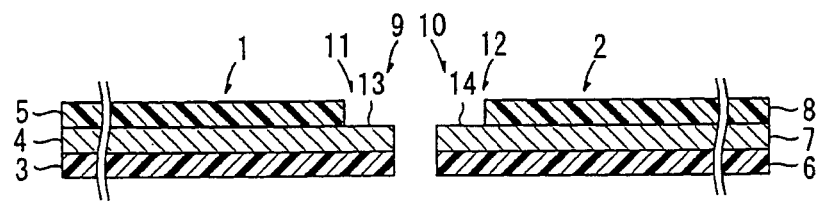
FIG. 1 is a cross-sectional view of a principal part, showing an embodiment of a flexible wired circuit board according to the present invention, where
Figure 1:
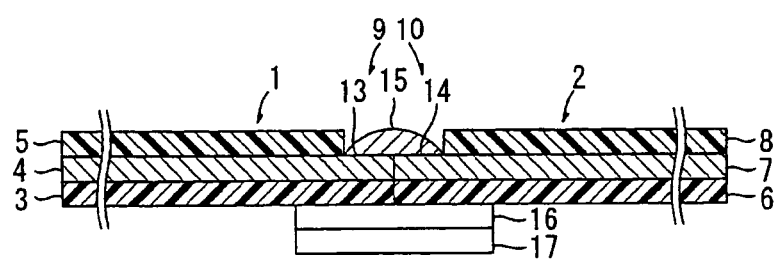
Figure 1:
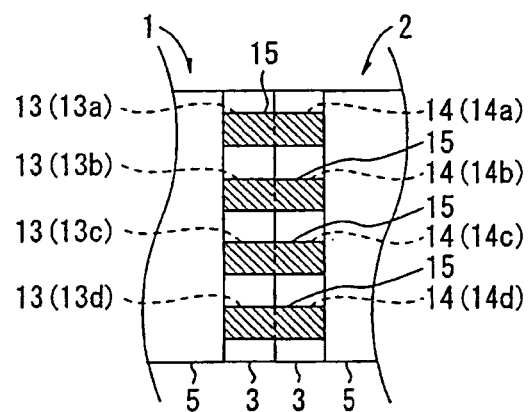

FIG. 1 is a cross-sectional view of a principal part, showing a flexible wired circuit board according to an embodiment of the present invention.

In FIG. 1, the flexible wired circuit board comprises a first wired circuit board 1 and a second wired circuit board 2.

The first wired circuit board 1 is formed by successively laminating a first base insulating layer 3, a first conductor pattern 4 composed of a plurality of wirings formed on the first base insulating layer 3, and a first cover insulating layer 5 formed on the first base insulating layer 3 so as to coat the first conductor pattern 4.

The second wired circuit board 2 is formed by successively laminating a second base insulating layer 6, a second conductor pattern 7 composed of a plurality of wirings formed on the second base insulating layer 6, and a second cover insulating layer 8 formed on the second base insulating layer 6 so as to coat the second conductor pattern 7.

Although the first base insulating layer 3 and the second base insulating layer 6 are not particularly limited, provided that they have insulating properties and flexibility, they are composed of a resin film of polyimide resin, polyester resin, acrylic resin, polyether nitrile resin, polyether sulfone resin, polyethylene telephthalate resin, polyethylene naphthalate resin, polyvinyl chloride resin, or the like for example. They are preferably composed of a polyimide resin film. The respective thicknesses of the first base insulating layer 3 and the second base insulating layer 6 are approximately the same, for example, 10 to 50 μm.

The first base insulating layer 3 and the second base insulating layer 6 are formed by a known method such as affixation of a resin film or casting of a resin solution.

Although the first conductor pattern 4 and the second conductor pattern 7 are not particularly limited, provided that they have conductive properties, they are composed of a metal foil of copper, chromium, nickel, aluminum, stainless, copper-beryllium, phosphor bronze, iron-nickel, their alloys, or the like, for example. They are preferably composed of a copper foil. The respective thicknesses of the first conductor pattern 4 and the second conductor pattern 7 are approximately the same, for example, 10 to 35 μm.

Although the first conductor pattern 4 and the second conductor pattern 7 are not particularly limited, they are formed by a known patterning method such as an additive method or a subtractive method.

The first cover insulating layer 5 and the second cover insulating layer 8 are composed of the same resin film as that of the first base insulating layer 3 and the second base insulating layer 6, and are preferably composed of a polyimide resin film. The respective thicknesses of the first cover insulating layer 5 and the second cover insulating layer 8 are approximately the same, for example, 4 to 50 μm.

The first cover insulating layer 5 and the second cover insulating layer 8 are respectively formed by casting a resin solution on surfaces of the first base insulating layer 3 and the second base insulating layer 6 so as to coat the first conductor pattern 4 and the second conductor patter 7, followed by drying and curing, or affixing a resin film thereto, for example. Further, they are formed simultaneously with patterning by casting a photosensitive resin solution, followed by exposure and development.

In the lamination of the layers, an adhesive layer may be interposed therebetween, as required. When the adhesive layer is interposed between the layers, the thickness of each of the layers includes the thickness of the adhesive layer.

The first wired circuit board 1 and the second wired circuit board 2 respectively comprise a first connection terminal portion 9 and a second connection terminal portion 10.

The first connection terminal portion 9 is formed by forming a first opening 11 in the first cover insulating layer 5 in one end in the longitudinal direction of the first wired circuit board 1 (a predetermined portion directed from one edge in the longitudinal direction of the first wired circuit board toward the opposite edge thereof), as shown in FIG. 1(a).

The first opening 11 is formed as a pattern to which the one end in the longitudinal direction of the first wired circuit board 1 is opened simultaneously with the formation of the first cover insulating layer 5 in a case where photosensitive resin is patterned, for example.

On the other hand, the first opening 11 is formed by a known processing method such as drilling processing, punching processing, laser processing, or etching processing in a case where a resin solution is cast or a case where a resin film is affixed, for example.

In the first connection terminal portion 9, the wirings composing the first conductor pattern 4 exposed from the first opening 11 are respectively taken as a plurality of (four) first connection terminals 13a, 13b, 13c, and 13d (hereinafter indicated by only the first connection terminals 13 when the terminals are not distinguished), as shown in FIG. 1(c). The first connection terminals 13 are arranged in parallel in the one end in the longitudinal direction of the first wired circuit board 1 with predetermined spacing in the width direction perpendicular to the longitudinal direction, for example.

In the second connection terminal portion 10, the wirings composing the second conductor pattern 7 exposed from the second opening 12 are respectively taken as a plurality of (four) second connection terminals 14a, 14b, 14c, and 14d (hereinafter indicated by only second connection terminals 14 when the terminals are not distinguished), as shown in FIG. 1(c). The second connection terminals 14 are arranged in parallel in one end in the longitudinal direction of the second wired circuit board 2 with predetermined spacing in the width direction perpendicular to the longitudinal direction, for example.

A gold plating layer or the like may be formed on surfaces of the first connection terminals 13 and the second connection terminals 14 in order to improve corrosion resistance, for example.

The flexible wired circuit board is formed by connecting the first wired circuit board 1 and the second wired circuit board 2 to each other, as shown in FIG. 1(b). In order to connect the first wired circuit board 1 and the second wired circuit board 2, a relay substrate 16 is prepared, for example. The one end in the longitudinal direction of the first wired circuit board 1 and the one end in the longitudinal direction of the second wiring circuit 2 are arranged so as to be opposed such that the first wired circuit board 1 and the second wired circuit board 2 are abutted against each other along the longitudinal direction on the relay substrate 16, and the first wired circuit board 1 and the second wired circuit board 2 are affixed to a surface of the relay substrate 16 with an adhesive layer (not shown) interposed between the wired circuit boards and the surface of the relay substrate 16.

The relay substrate 16 is formed in such a substantially rectangular shape as to be opposable in the thickness direction to the first connection terminal portion 9 and the second connection terminal portion 10 that are abutted against each other, for example. The relay substrate 16 is composed of the same resin as that composing the first base insulating layer 3 and the second base insulating layer 6, and is preferably composed of polyimide resin or polyester resin. Further, the thickness of the relay substrate 16 is 25 to 125 μm, for example.

The relay substrate 16 is affixed to back surfaces of the first base insulating layer 3 and the second base insulating layer 6 that are respectively opposed in the thickness direction to the first connection terminal portion 9 and the second connection terminal portion 10 (surfaces, on the opposite side of surfaces on which the first conductor pattern 4 and the second conductor pattern 7 are formed, of the first base insulating layer 3 and the second base insulating layer 6 respectively) through an adhesive layer (not shown) so as to extend over the first base insulating layer 3 and the second base insulating layer 6.

Although the relay substrate 16 can also serve as the function of a reinforcing plate, a reinforcing plate 17 may be made to adhere to a back surface of the relay substrate 16 (a surface, on the opposite side of the surface that is affixed to the first base insulating layer 3 and the second base insulating layer 6, of the relay substrate 16).

Although the reinforcing plate 17 is not particularly limited, provided that it has approximately the same shape as the relay substrate 16 and has strength as a reinforcing plate, it is composed of a metal plate such as copper, aluminum, stainless, an iron alloy, or the like, for example. It is preferably an aluminum plate or a stainless plate. Further, the thickness of the reinforcing plate 17 is 18 to 500 μm, for example. The reinforcing plate 17 is affixed to the back surface of the relay substrate 16 through an adhesive layer (not shown), for example, although it is not particularly limited.

When the first wired circuit board 1 and the second wired circuit board 2 are connected to each other in such a way, the first connection terminals 13 and the second connection terminals 14 are respectively arranged in line with each other so as to be continuous along the longitudinal direction of the first wired circuit board 1 and the second wired circuit board 2 as viewed from the top, as shown in FIG. 1(c). In the flexible wired circuit board, the first connection terminals 13 and the second connection terminals 14 are respectively electrically connected to each other by a solder layer 15 serving as a connection conductive portion. The solder layer 15 is formed by applying a solder paste in a substantially rectangular shape, as viewed from the top, so as to extend over the surfaces of each of the first connection terminals 13 and each of the second connection terminals 14 that are opposed to each other, followed by heating and pressurization.

Consequently, the solder layer 15 is provided so as to continuously extend over the surfaces of the first connection terminal 13 and the second connection terminal 14 that are arranged on the same side with respect to the solder layer 15.

Although in the flexible wired circuit board thus formed, the first connection terminals 13 and the second connection terminals 14 are respectively arranged so as to be opposed to each other along the longitudinal direction of the first wired circuit board 1 and the second wired circuit board 2, the solder layer 15 is not interposed between opposed surfaces of each of the first connection terminals 13 and each of the second connection terminals 14 but is continuously formed so as to extend over the surfaces of the first connection terminal 13 and the second connection terminal 14.

Therefore, it is judged by visual observation whether or not the solder layer 15 connects (extends over) each of the first connection terminals 13 and each of the second connection terminals 14 that are opposed to each other, as viewed from the top, as shown in FIG. 1(c). As a result, in the flexible wired circuit board, electrical continuity inspection can be omitted, so that burdens on the number of processes and the cost caused thereby can be reduced.

Although in the above-mentioned embodiment, the first wired circuit board 1 and the second wired circuit board 2 are respectively formed of the first base insulating layer 3 and the second base insulating layer 6, the first conductor pattern 4 and the second conductor pattern 7, and the first cover insulating layer and the second cover insulating layer 8, a first wired circuit board 1 and/or a second wired circuit board 2 may be provided with a metal substrate, for example.

Figure 2:
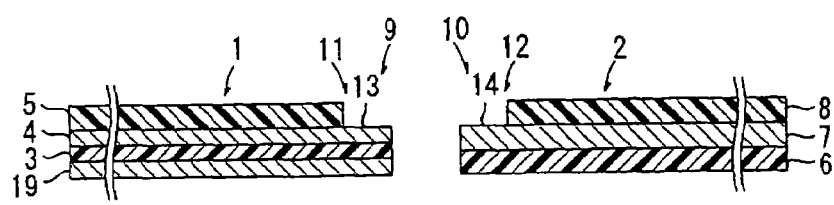
FIG. 2 is a cross-sectional view of a principal part, showing another embodiment of a flexible wired circuit board according to the present invention, where
Figure 2:
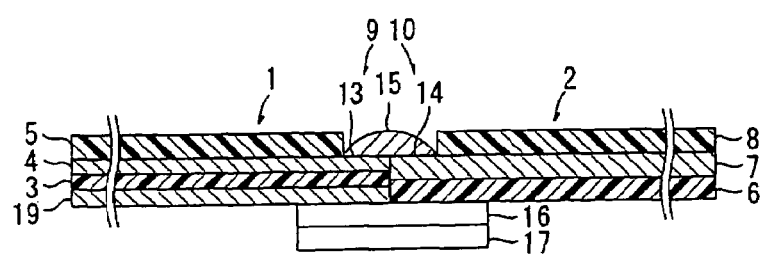
Figure 2:
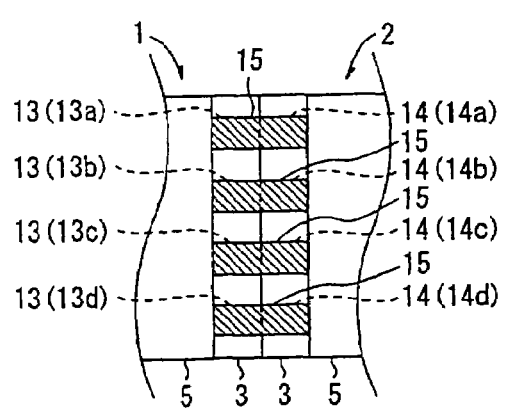

FIG. 2 is a cross-sectional view of a principal part showing a flexible wired circuit board according to such an embodiment.

In FIG. 2, the same members as those shown in FIG. 1 are assigned the same reference numerals and hence, the description thereof is not repeated.

In FIG. 2, the flexible wired circuit board comprises a first wired circuit board 1 and a second wired circuit board 2.

The first wired circuit board 1 is formed by successively laminating a metal substrate 19, a first base insulating layer 3 formed on the metal substrate 19, a first conductor pattern 4, and a first cover insulating layer 5. The first wired circuit board 1 is used as a suspension board with a circuit, for example.

Although the metal substrate 19 is not particularly limited, it is composed of a metal thin plate such as copper, aluminum, a 42 alloy, stainless, an iron alloy, or the like, for example. The thickness of the metal substrate 19 is 10 to 100 μm, for example.

The first wired circuit board 1 is formed in the same method as the first wired circuit board 1 shown in FIG. 1 after the first base insulating layer 3 is formed on the metal substrate 19 by a known method such as affixation of a film or casting of a resin solution.

The thickness of the first base insulating layer 3 is 3 to 20 μm, for example, and the thickness of the first conductor pattern 4 is 3 to 20 μm, for example.

Although in the first wired circuit board 1, the total thickness of the metal substrate 19, the first base insulating layer 3, and the first conductor pattern 4 (including an adhesive layer) is made approximately the same as the total thickness of a second base insulating layer 6 and a second conductor pattern 7 (including an adhesive layer) in the second wired circuit board 2. Such formation allows reliability in connection to be improved by a solder layer 15.

The second wired circuit board 2 is formed in the same method as the second wired circuit board 2 shown in FIG. 1. The second wired circuit board 2 is used as a control circuit board connected to the suspension substrate with a circuit, for example.

The first wired circuit board 1 and the second wired circuit board 2 respectively comprise first connection terminals 13 and second connection terminals 14 in the same manner as described above, as shown in FIG. 2(b).

In the flexible wired circuit board, the first wired circuit board 1 and the second wired circuit board 2 are arranged in the longitudinal direction, the solder layer 15 is formed so as to continuously extend over surfaces of each of first connection terminals 13 and each of second connection terminals 14 that are opposed to each other, and the first connection terminals 13 and the second connection terminals 14 are respectively electrically connected to each other by the solder layer 15 in the same manner as described above.

Also in the flexible wired circuit board, a relay substrate 16 is affixed and a reinforcing plate 17 is affixed, as required, to back surfaces of the metal substrate 19 and the second base insulating layer 6 that are respectively opposed in the thickness direction to a first connection terminal portion 9 and a second connection terminal portion 10 so as to extend over the metal substrate 19 and the second base insulating layer 6 in the same manner as described above.

Although in the flexible wired circuit board, the first connection terminals 13 and the second connection terminals 14 are also respectively arranged so as to be opposed to each other along the longitudinal direction of the first wired circuit board 1 and the second wired circuit board 2, the solder layer 15 is not interposed between opposed surfaces of each of the first connection terminals 13 and each of the second connection terminals 14 but is continuously formed so as to extend over the surfaces of the first connection terminal 13 and the second connection terminal 14.

Therefore, it is judged by visual observation whether or not the solder layer 15 connects (extends over) each of the first connection terminals 13 and each of the second connection terminals 14 that are opposed to each other, as viewed from the top, as shown in FIG. 2(c). As a result, in the flexible wired circuit board, electrical continuity inspection can be omitted, so that burdens on the number of processes and the cost caused thereby can be reduced.

Figure 3:
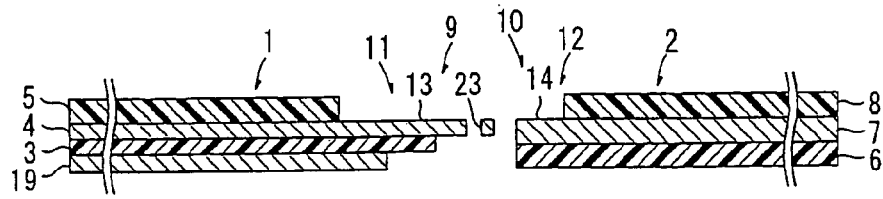
FIG. 3 is a cross-sectional view of a principal part showing still another embodiment of a flexible wired circuit board according to the present invention, where
Figure 3:
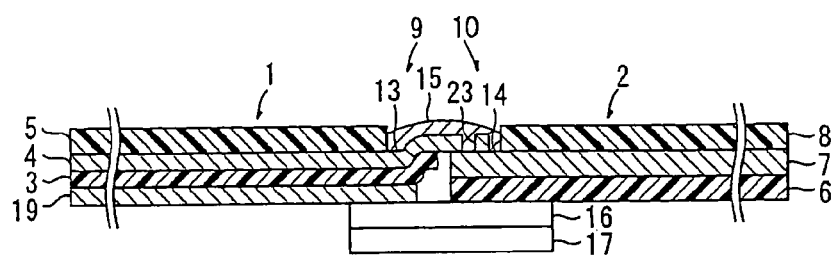
Figure 3:
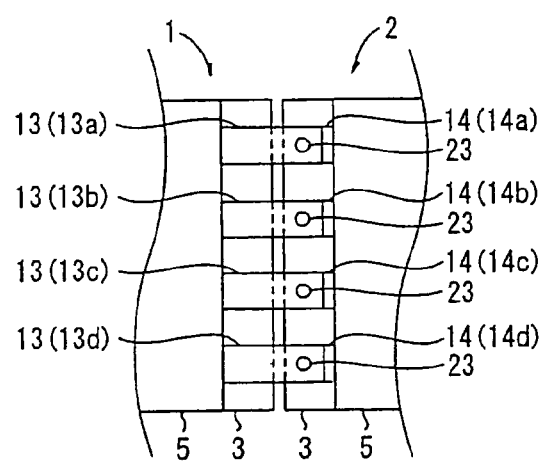
Figure 3:
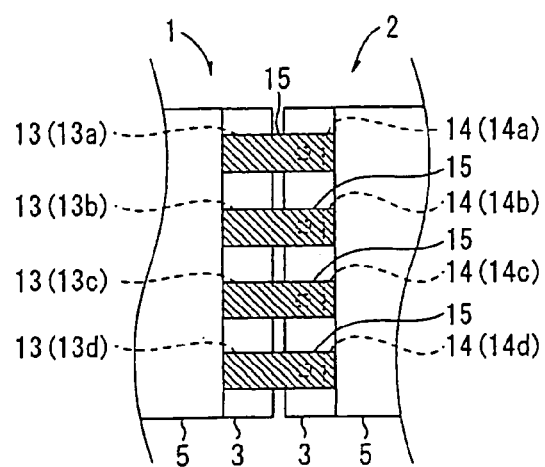
Figure 4:
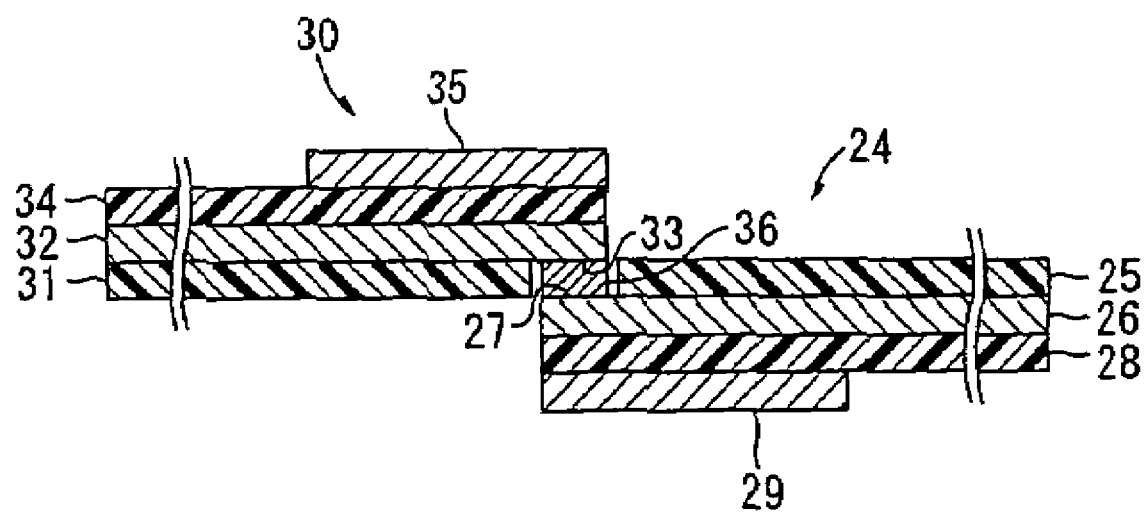
FIG. 4 is a cross-sectional view of a principal part, showing an embodiment of a conventional flexible wired circuit board.

Furthermore, when the first wired circuit board 1 comprises the metal substrate 19, as described above, the first wired circuit board 1 and the second wired circuit board 2 can be also connected to each other, as shown in FIG. 3. In FIG. 3, the same members as the above-mentioned ones are assigned the same reference numerals and hence, the description thereof is not repeated.

That is, in FIG. 3, a first wired circuit board 1 comprises a metal substrate 19, a first base insulating layer 3, a first conductor pattern 4, and a first cover insulating layer 5, as described above. In one end in the longitudinal direction of the first wired circuit board 1, the first base insulating layer 3 is made longer than the metal substrate 19 so as to project toward the second wired circuit board 2, and a first connection terminal 13 is made longer than the first base insulating layer 3 so as to project toward the second wired circuit board 2, as shown in FIG. 3(a). In order that the first base insulating layer 3 is made longer than the metal substrate 19, and the first connection terminal 13 is made longer than the first base insulating layer 3, the first base insulating layer 3 and the metal substrate 19 are respectively etched after the layers are laminated, for example.

A portion (a free end), which extends beyond the first base insulating layer 3, of the first connection terminal 13 is formed with a through hole 23 that penetrates through the first connection terminal 13 in the thickness direction.

The first wired circuit board 1 and the second wired circuit board 2 are connected to each other by respectively placing the first connection terminals 13 in the first wired circuit board 1 on the second connection terminals 14 in the second wired circuit board 2 such that a back surface (a surface, on the opposite side of a surface where a solder layer 15 is formed) of the first connection terminal 13 is partially overlapped with a surface of the second connection terminal 14, as shown in FIG. 3(c), and forming the solder layer 15 on the surfaces of each of the first connection terminals 13 and each of the second connection terminals 14 that are opposed to each other so as to extend over the first connection terminal 13 and the second connection terminal 14, as shown in FIG. 3(d).

Each of the first connection terminals 13 is bent such that one step is formed along the longitudinal direction of the first conductor pattern 4 so as to be overlapped with the opposed second connection terminal 14. One end in the longitudinal direction of the first base insulating layer 3 having the first connection terminals 13 formed therein is bent by following the first connection terminals 13 in the same direction, so that it is arranged so as to be opposed to the second conductor pattern 7 with predetermined spacing in the longitudinal direction. Further, one end in the longitudinal direction of the metal substrate 19 is arranged so as to be opposed to the second base insulating layer 6 with predetermined spacing in the longitudinal direction.

The through hole 23 is also filled with the solder layer 15 in each of the first connection terminals 13 and each of the second connection terminals 14 that are opposed to each other, thereby allowing reliability in connection between the first connection terminal 13 and the second connection terminal 14 to be further improved.

Also in the flexible wired circuit board, a relay substrate 16 is affixed and a reinforcing plate 17 is affixed, as required, to back surfaces of the metal substrate 19 and the second base insulating layer 6 that are respectively opposed in the thickness direction to a first connection terminal portion 9 and a second connection terminal portion 10 so as to extend over the metal substrate 19 and the second base insulating layer 6 in the same manner as described above.

Although in the flexible wired circuit board shown in FIG. 3, the first connection terminals 13 and the second connection terminals 14 are respectively overlapped with each other in the thickness direction, thereby making it possible to prevent the possibility that when a solder paste is applied so as to extend over each of the first connection terminals 13 and each of the second connection terminals 14 that are opposed to each other, for example, the solder paste enters a clearance between opposed end surfaces of the first connection terminal 13 and the second connection terminal 14 to lead to the metal substrate 19 in the first wired circuit board 1, as in the flexible wired circuit board shown in FIG. 2, so that the first conductor pattern 4 and the metal substrate 19 are short-circuited.

Although in the above-mentioned description, the flexible wired circuit board comprising the first wired circuit board 1 and the second wired circuit board 2 is exemplified, the wired circuit board according to the present invention may be a rigid wired circuit board, or comprises various types of wired circuit boards such as a single-sided wired circuit board, a double-sided wired circuit board, and a multilayer wired circuit board.

EXAMPLES

Although examples will be shown to specifically describe the present invention, the present invention is not limited to the examples.

Example 1

After a copper foil was affixed to a first base insulating layer composed of a polyimide film having a thickness of 12.5 μm through an epoxy adhesive layer having a thickness of 10 μm, a first conductor pattern composed of a copper wiring having a thickness of 18 μm was formed by a subtractive method. Further, a first cover insulating layer composed of a polyimide film having a thickness of 12.5 μm was laminated on the first conductor pattern through an epoxy adhesive layer having a thickness of 15 μm. A first opening serving as a first connection terminal portion was formed in one end in the longitudinal direction, thereby obtaining a first wired circuit board (see FIG. 1(a)).

After a copper foil was affixed to a second base insulating layer composed of a polyimide film having a thickness of 12.5 μm through an epoxy adhesive layer having a thickness of 10 μm, a second conductor pattern composed of a copper wiring having a thickness of 18 μm was formed by a subtractive method. Further, a second cover insulating layer composed of a polyimide film having a thickness of 12.5 μm was laminated on the second conductor pattern through an epoxy adhesive layer having a thickness of 15 μm. A second opening serving as a second connection terminal portion was formed in one end in the longitudinal direction, thereby obtaining a second wired circuit board (see FIG. 1(a)).

A reinforcing plate composed of an aluminum plate having a thickness of 300 μm, affixed to a relay substrate composed of a polyimide film having a thickness of 50 μm, was then prepared. The first wired circuit board and the second wired circuit board were then arranged so as to be opposed to each other on the relay substrate and affixed to each other such that first connection terminals and second connection terminals were respectively abutted against each other in the longitudinal direction (see FIG. 1(b)

Thereafter, a solder paste was applied so as to continuously coat surfaces of each of the first connection terminals and each of the second connection terminals that are opposed to each other, followed by pressurization and heating, to form a solder layer, thereby obtaining a wired circuit board (see FIG. 1(b) and FIG. 1(c)).

Example 2

A first base insulating layer composed of a polyimide film having a thickness of 10 μm, a first conductor pattern composed of a copper wiring having a thickness of 10 μm formed by an additive method, and a first cover insulating layer composed of a polyimide film having a thickness of 5 μm were successively laminated on a supporting substrate composed of a stainless foil having a thickness of 20 μm. A first opening serving as a first connection terminal portion was formed in one end in the longitudinal direction, thereby obtaining a first wired circuit board (see FIG. 2(a)

After a copper foil was affixed to a second base insulating layer composed of a polyimide film having a thickness of 12.5 μm through an epoxy adhesive layer having a thickness of 10 μm, a second conductor pattern composed of a copper wiring having a thickness of 18 μm was formed by a subtractive method. Further, a second cover insulating layer composed of a polyimide film having a thickness of 12.5 μm was laminated on the second conductor pattern through an epoxy adhesive layer having a thickness of 15 μm. A second opening serving as a second connection terminal portion was formed in one end in the longitudinal direction, thereby obtaining a second wired circuit board (see FIG. 2(a)).

A reinforcing plate composed of an aluminum plate having a thickness of 300 μm, affixed to a relay substrate composed of a polyimide film having a thickness of 50 μm, was then prepared. The first wired circuit board and the second wired circuit board were then arranged so as to be opposed to each other on the relay substrate and affixed to each other such that first connection terminals and second connection terminals were respectively abutted against each other in the longitudinal direction (see FIG. 2(b)).

Thereafter, a solder paste was applied so as to continuously coat surfaces of each of the first connection terminals and each of the second connection terminals that are opposed to each other, followed by pressurization and heating, to form a solder layer, thereby obtaining a wired circuit board (see FIG. 2(b) and FIG. 2(c)).

Example 3

A first base insulating layer composed of a polyimide film having a thickness of 10 μm, a first conductor pattern composed of a copper wiring having a thickness of 10 μm formed by an additive method, and a first cover insulating layer composed of a polyimide film having a thickness of 4

μm were successively laminated on a supporting substrate composed of a stainless foil having a thickness of 25 μm. A first opening serving as a first connection terminal portion was formed in one end in the longitudinal direction. Thereafter, the supporting substrate and the first base insulating layer that correspond to the first connection terminal portion were etched, to project the first base insulating layer from the supporting substrate by 1 mm in the first connection terminal portion, and to project each of first connection terminals in the first conductor pattern composed of a copper wiring having a width of 200 μm from the first base insulating layer by 1 mm, so that a circular through hole having a diameter of 0.05 mm was formed at the center in the width direction of a free end of each of the first connection terminals, thereby obtaining a first wired circuit board (see FIG. 3(a)).

After a copper foil was affixed to a second base insulating layer composed of a polyimide film having a thickness of 12.5 μm through an epoxy adhesive layer having a thickness of 10 μm, a second conductor pattern composed of a copper wiring having a thickness of 18 μm was formed by a subtractive method. Further, a second cover insulating layer composed of a polyimide film having a thickness of 12.5 μm was laminated on the second conductor pattern through an epoxy adhesive layer having a thickness of 15 μm. A second opening serving as a second connection terminal portion was formed in one end in the longitudinal direction, thereby obtaining a second wired circuit board (see FIG. 3(a)).

The free end of each of the first connection terminals in the first wired circuit board was bent such that one step was formed in the longitudinal direction, and was superimposed on the opposed second connection terminal, and the first base insulating layer is also bent such that one step was formed by following the first connection terminal. A solder paste was applied so as to continuously extend over surfaces of the first connection terminal and the second connection terminal and such that the through hole was filled with the solder paste, followed by pressurization and heating, to form a solder layer, thereby obtaining a wired circuit board (see FIG. 3(b) and 3(c)).

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
a first wired circuit board having a first connection terminal;
a second wired circuit board having a second connection terminal;
a relay substrate that is coupled to the first wired circuit board and the second wired circuit board to enable connection of the first connection terminal and the second connection terminal; and
a connection conductive portion that contacts the first connection terminal and the second connection terminal for electrically connecting the first connection terminal and the second connection terminal to each other,
wherein the connection conductive portion is connected to the first connection terminal and the second connection terminal so as not to be interposed between opposed surfaces of the first connection terminal and the second connection terminal,
wherein the first connection terminal and the second connection terminal are oriented to face in a same direction and wherein the connection conductive portion is provided so as to extend over the first connection terminal and the second connection terminal, and
wherein the relay substrate is positioned on an opposite side of the first wired circuit board relative to the first connection terminal and on an opposite side of the second wired circuit board relative to the second connection terminal and the connection conductive portion is provided to continuously cover the surfaces of the first connection terminal and the second connection terminal.

2. The wired circuit board according to claim 1, wherein the first connection terminal and the second connection terminal are arranged to partially overlap with each other.

3. The wired circuit board according to claim 2, further comprising:
a through hole that is positioned at one of the first connection terminal and the second connection terminal, the through hole being configured to penetrate the first connection terminal or the second connection terminal in a thickness direction at a portion where the first connection terminal and the second connection terminal overlap with each other, wherein the through hole is brought into contact with the connection conductive portion.

4. A connection structure of a wired circuit board comprising:
a first wired circuit board having a first board upper surface and a first connection terminal that is positioned on the first board upper surface;
a second wired circuit board having a second board upper surface and a second connection terminal that is positioned on the second board upper surface, the first wired circuit board and the second wired circuit board being configured to abut along respective edges to form a substantially coplanar structure that is defined by the first board upper surface and the second board upper surface; and
a connection conductive portion that contacts the first connection terminal and the second connection terminal for electrically connecting the first connection terminal and the second connection terminal to each other,
wherein the connection conductive portion is connected to the first connection terminal and the second connection terminal so as not to be interposed between opposed surfaces of the first connection terminal and the second connection terminal.

5. The connection structure of the wired circuit board according to claim 4, wherein the first connection terminal and the second connection terminal are oriented to face in a same direction and the connection conductive portion is provided so as to extend over the first connection terminal and the second connection terminal.

6. The connection structure of the wired circuit board according to claim 5, wherein the connection conductive portion is provided to continuously cover the surfaces of the first connection terminal and the second connection terminal.

7. A wired circuit board comprising:
a first wired circuit board having a first board upper surface and a first connection terminal that is positioned on the first board upper surface;
a second wired circuit board having a second board upper surface and a second connection terminal that is positioned on the second board upper surface, wherein the first connection terminal and the second connection terminal are arranged to partially overlap with each other;

a relay substrate that is coupled to the first wired circuit board and the second wired circuit board to enable connection of the first connection terminal and the second connection terminal, the relay substrate being positioned on an opposite side of the first wired circuit board relative to the first connection terminal and on an opposite side of the second wired circuit board relative to the second connection terminal;

a connection conductive portion that contacts an upper surface of the first connection terminal and an upper surface of the second connection terminal for electrically connecting the first connection terminal and the second connection terminal to each other; and a through hole that is positioned at one of the first connection terminal and the second connection terminal, the through hole being configured to penetrate the first connection terminal or the second connection terminal in a thickness direction at a portion where the first connection terminal and the second connection terminal partially overlap with each other, wherein the connection conductive portion is provided in the through hole and wherein the connection conductive portion is connected to the first connection terminal and the second connection terminal so as not to be interposed between opposed surfaces of the first connection terminal and the second connection terminal.

* * * * *